US006062339A

United States Patent [19]

Hathaway

[11] Patent Number: 6,062,339

[45] Date of Patent: May 16, 2000

[54] COMPACT SPIRAL CAVITY LOUDSPEAKER ENCLOSURE

[76] Inventor: Dana B. Hathaway, 9 Swetts Hill, Amesbury, Mass. 01913

[21] Appl. No.: 08/562,731

[22] Filed: Nov. 27, 1995

[51] Int. Cl.$^{7}$ ........................................ H05K 5/00

[52] U.S. Cl. .......................... 181/156; 181/160; 181/199

[58] Field of Search .................................... 181/156, 152, 181/153, 196, 199, 160; 381/154, 156, 159

[56] References Cited

U.S. PATENT DOCUMENTS 2,277,525 3/1942 Mercurius ............................... 181/156
4,168,761 9/1979 Pappanikolaou ......................... 181/156
4,298,087 11/1981 Launay .................................... 181/153
5,189,706 2/1993 Saeki .................................. 181/156 X
5,432,860 7/1995 Kasajima et al. ....................... 381/156

*Primary Examiner*—Khanh Dang

[57] ABSTRACT

A vented or bass reflex speaker. The speaker is secured to an inner sleeve which inner sleeve is received within an outer sleeve with the sleeves defining an annulus therebetween. Acoustical flow channels are formed in the annulus. The back of the inner sleeve is spaced apart from the back of the outer sleeve to form a vented volume. The air in the channels is caused, by the loudspeaker driver, to resonate with the volume of air contained within the open-ended inner sleeve forming a Helmholtz element.

14 Claims, 2 Drawing Sheets

COMPACT SPIRAL CAVITY LOUDSPEAKER ENCLOSURE

BACKGROUND OF THE INVENTION

The current practice of installing loudspeakers into vehicles such as automobiles is to fasten the loudspeakers into holes in the interior panels of the vehicular compartment.

This practice is intuitively reasonable. It uses the space between the interior panel and the outside wall (panel) of the car (between panel location). It is however, responsible for a number of well understood problems. The loudspeaker is exposed to the harsh environmental conditions that exist between the inside and outside panels of an automobile. Loudspeakers are routinely exposed to the water drainage from windows and door drains. As a result of this splash shields and waterproof loudspeaker component parts are often used. The attempts to provide environmental protection of the loudspeaker mechanism are both costly and compromise the sound quality of the loudspeaker.

With the exception of costly custom made fiberglass enclosures supplied by after market installers, the loudspeakers are allowed to operate in a near free air condition. This is a result of the very leaky air seal between the inside and outside panels in a car. Car manufacturers generally do not provide an air seal between these panels due to the requirement for water drainage openings.

Operation of the loudspeaker/woofer without acoustic loading of the rear wave radiation causes a number of problems. First, at low frequencies, only the mechanical stiffness of the suspension components control the amount of cone motion excursions. High cone excursions can damage the loudspeaker and produce poor sound quality. Second, without containment of the loudspeaker rear wave radiation, sound pressure cancellation will occur. This has the effect of greatly reducing bass and lower midrange sound output no matter what size loudspeaker is used.

The present invention is a loudspeaker assembly for controlling the rear wave radiation of a loudspeaker using an extremely compact enclosure. A cavity, preferably a spiral cavity, is formed which produces a Helmholtz acoustic element. This element provides acoustic loading and enhances bass output to frequencies well below those achieved by conventional enclosures of the same size.

The small size and shape of the loudspeaker assembly provides easy installation in a panel location without the need for a driver mounting hole. The loudspeaker assembly eliminates the problems of conventional between panel location. Loudspeaker rear wave radiation is totally contained by the enclosure so that sound pressure cancellation is eliminated.

Because part of the cavity enclosure can be formed by molding a simple depression into the interior panel, no driver mounting holes are required. Loudspeaker installation during vehicle assembly is greatly simplified.

The major benefit of this invention is a loudspeaker assembly which produces a bass sound output from a loudspeaker, in an enclosure so compact, that it can be surface mounted on the interior panel of a vehicular passenger compartment. Alternatively, it can be mounted in any flat surface, i.e. wall, ceiling, etcetera.

Broadly the invention comprises an inner sleeve to which a loudspeaker is secured. The inner sleeve is received within an outer sleeve and the inner and outer sleeves define an annulus therebetween. Channels are formed in the annulus. In the preferred embodiment (vented or bass reflex speaker) the open rear or back of the inner sleeve is spaced apart from the rear or back of the outer sleeve to form a vented volume. The air in the channels is caused, by the loudspeaker driver, to resonate with the volume of air contained within the open ended inner sleeve forming a Helmholtz element.

In an alternative embodiment a bandpass frequency response can be achieved. The loudspeaker driver is mounted in a sealed enclosure which is accomplished by closing the open rear or back of the inner sleeve. The sealed inner sleeve is spaced from the closed end of the outer sleeve in order to form an internal volume of air. The air in the channels is caused by the driver to resonate with the internal volume of air to form a Helmholtz element.

In another alternative embodiment, the inner sleeve could be modified to include its own Helmholtz element which then communicates with the internal volume of air. The air in the channels is then cause to resonate by action of the Helmholtz element of the inside sleeve with the internal volume of air producing an additional Helmholtz element.

Broadly, the channels at one end are in acoustical communication with the loudspeaker and at the other end (front end) communicate with the ambient environment (the car interior). In a particularly preferred embodiment they are spirals. However, in other embodiments they may be sinusoidal with either uniform or non-uniform waves comprising the sinusoidal wave form. If desired, the channels may be straight lined, saw toothed, crenelated, etcetera.

DESCRIPTION OF THE PREFERRED EMBODIMENT(s)

The preferred embodiment is described with reference to a vented or bass reflex device.

Figure 1:
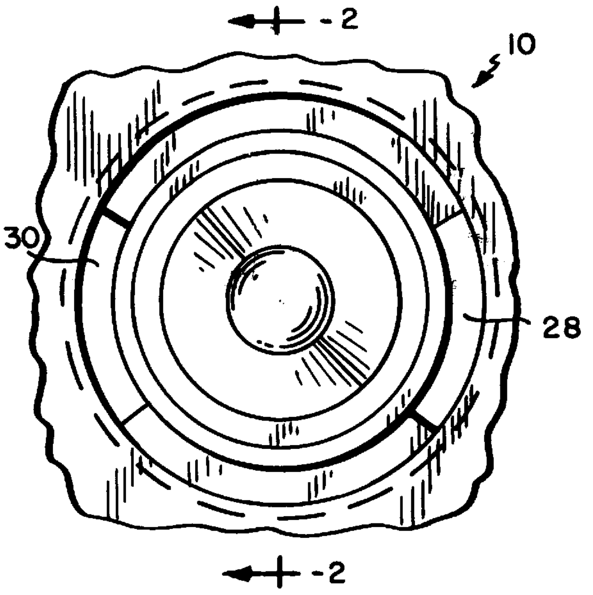
FIG. 1 is a front view of a loudspeaker assembly embodying the invention.
Figure 3:
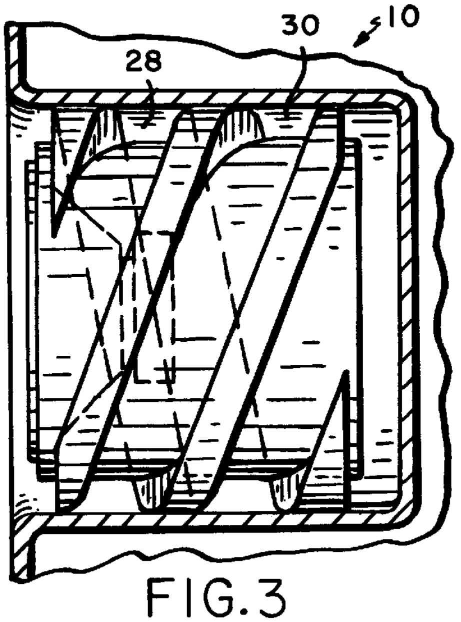
FIG. 3 is a side elevational view of FIG. 1.
Figure 2:
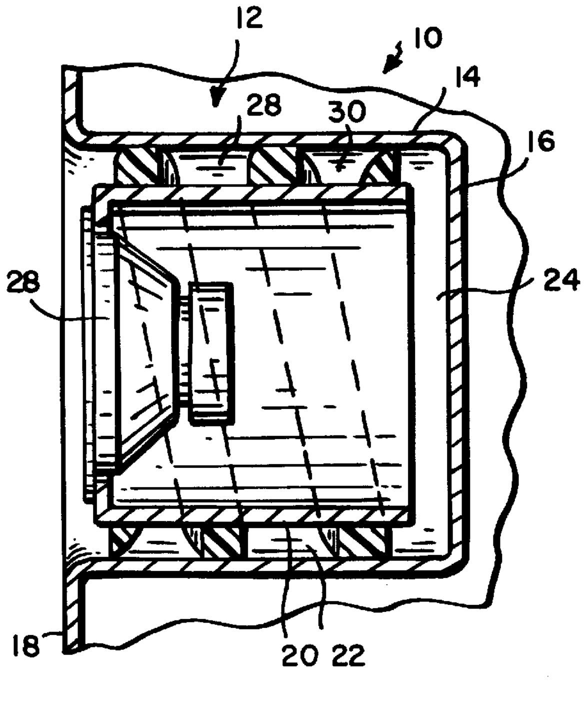
FIG. 2 is a side sectional view of FIG. 1 taken along lines 2—2 of FIG. 1.

Referring to FIGS. 1, 2 and 3, a loudspeaker assembly is shown generally at 10 and comprises an outer housing 12, the outer housing 12 comprising an outer sleeve 14, a rear wall 16 joined to the outer sleeve 14, and a flange 18 at the forward end of the housing assembly 12. An inner sleeve 20 is concentrically aligned with the outer sleeve 14 and defines an annulus 22 therebetween. The rear end of the inner sleeve 20 is spaced apart from the rear wall 16 of the outer sleeve 14 and defines a vented volume 24 between the inner sleeve 20 and the annulus 22. The inner sleeve comprises a flange 26 to which is secured a loudspeaker 27. Depending upon the relative size of the driver to the inner sleeve the flange 26 could be eliminated and the driver adhesively adhered to the end of the sleeve.

The annulus has received therein an insert, such as closed cell polyurethane foam, and formed in the insert are two channels 28 and 30. Each channel describes a helix through a 360° revolution from one end of the annulus to the other.

The channels are spaced apart in parallel relationship and offset by 180°. The channels therefore describe two acoustical flow paths, each following a helical 360° path from one end of the annulus to the other. The same effect can be achieved by molding the acoustical channels on the outer surface of the inner sleeve or on inner surface of the outer sleeve. The Helmholtz acoustical element is formed by the air in the channels 28 and 30 resonating with the vented volume 24.

In a working embodiment of the invention of FIGS. 1–3 and 5, the diameter of the inner sleeve was 4", the thickness of the annulus 22 was 1" and the depth of the vented volume 24 was 1". The channels each were 0.375 $in^2$ and 18" in length for a volume of 6.75 $in^3$. A 78 $in^3$ internal vented volume 24 of air (compliance element 1) combines with the 13.5 $in^3$ of air contained in the spiral cavities 28–30 (element 2 inertance) to form a Helmholtz acoustical element at 49 Hertz. Enhanced based output in a frequency range of 20 to 200 was realized.

The loudspeaker enclosure system is electrically driven to achieve a 6th order Butterworth high pass function. The electrical signal powering the loudspeaker is high passed by an electrical wave filter. By placing the high pass function of the filter in the vicinity of the Helmholtz resonance frequency, the cone motion of the loudspeaker driver can be further reduced. Since this high pass response function could reduce low frequency cone motion, the voice coil air gap can be filled with magnetic damping fluid for higher power handling and less acoustic compression due to voice coil DCR shifts.

Further refinements would include the incorporation of motional feedback in the power amplifier (electronics) to adjust the loudspeakers motional resonance and Q.

Figure 5:
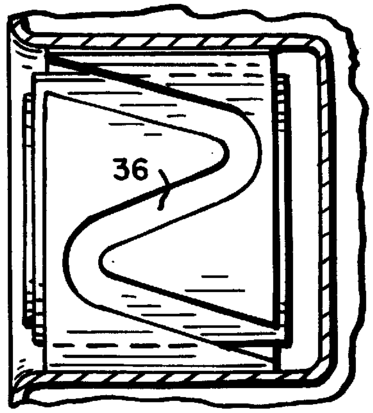
FIG. 5 is an illustration of an alternative channel configuration.

Referring to FIG. 5, an alternative embodiment of FIG. 1 of the groove of FIG. 1 is shown and comprises a sinusoidal groove 36 which again, extends from one end of the annulus to the other and effectively provides the same volume of acoustical flow path of the two spiral grooves of FIG. 1.

Figure 6:
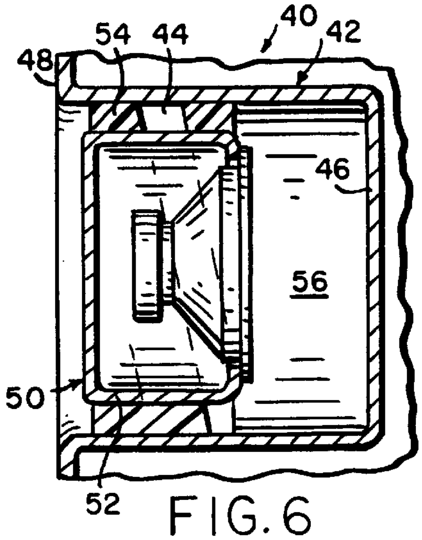
FIG. 6 is a side view of a loudspeaker configured with a bandpass type enclosure.
Figure 4:
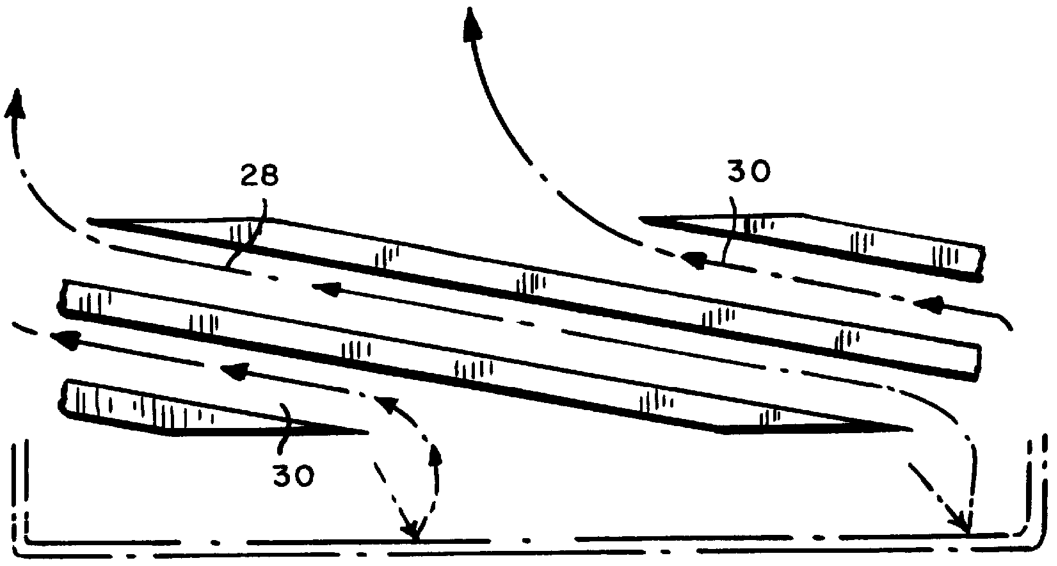
FIG. 4 is a Mercator-like projection of the channels of FIGS. 1–3.

An alternative embodiment of the invention is shown in FIG. 6 generally at 40 for a bandpass type loudspeaker enclosure. The loudspeaker assembly comprises a ring-like housing 42 having an outer sleeve 44 joined to a rear wall 46. The forward end of the housing includes a flange 48 by which the assembly can be secured to a panel or the like. The assembly 40 comprises a sealed inner housing 50 which includes an inner sleeve 52 concentrically aligned with and spaced apart from the sleeve 44 to define an annulus 54 therebetween and an internal volume 56. As with the preferred embodiment, spiral grooves are formed in the annulus. The sealed housing support a loudspeaker as shown. The Helmholtz in the bandpass is formed by the air in the channels resonating with the air in the internal volume 56 (outer sleeve volume-inner sleeve volume).

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A loudspeaker assembly which comprises:

an outer sleeve having a front end and a rear end, a rear wall joined to the rear end of the outer sleeve;

an inner sleeve having a front end and a rear end, the inner sleeve aligned within the outer sleeve and defining an annulus therebetween, the rear end of the inner sleeve spaced apart from the rear wall of the outer sleeve to define a vented volume, the inner sleeve having a longitudinal axis and a first distance which extends from the front end to the rear end of the inner sleeve and which first distance is parallel to the longitudinal axis;

a loudspeaker secured to the front end of the inner sleeve;

at least one acoustical channel formed in the annulus and extending from the rear end of the inner sleeve to the front end of the inner sleeve a second distance greater than the first distance, the air resonating in the acoustical channel forming a Helmholtz resonator with said vented volume whereby acoustical loading and enhanced bass output in a frequency range of 20 to 200 Hz is realized.

2. The speaker of claim 1 wherein the channel is curvilinear.

3. The speaker of claim 2 wherein the channel describes a path of greater than 0° and less than 360° from the rear end to the front end of the inner sleeve.

4. The speaker of claim 1 wherein the channel comprises a spiral which completes a 360° revolution from the rear end of the inner sleeve to the front end of the inner sleeve.

5. The speaker of claim 3 wherein the channel comprises a spiral which completes a revolution of between about 180 to 360° from the rear end of the inner sleeve to the front end of the inner sleeve.

6. The speaker of claim 1 wherein the channel comprises a plurality of channels which extend from the rear end of the inner sleeve to the front end of the inner sleeve each of which describe a revolution of about 180° from the rear end of the inner sleeve to the front end of the inner sleeve.

7. The speaker of claim 1 which comprises a plurality of channels formed in the annulus, each of said channels describing a revolution of 360° from the rear end to the front end of the inner sleeve.

8. A loudspeaker assembly which comprises:

an outer sleeve having a front end and a rear end and a rear wall joined to the rear end of the outer sleeve;

a sealed inner sleeve having a front end and a rear end, said inner sleeve joined to the outer sleeve and aligned within the outer sleeve and defining an annulus therebetween, a loudspeaker secured to the rear end of the sealed inner sleeve, the rear end of the inner sleeve defining with the rear wall an internal volume therebetween, the inner sleeve having a longitudinal axis and a first distance which extends from the front end to the rear end of the inner sleeve and which first distance is parallel to the longitudinal axis;

at least one acoustical channel formed in the annulus and extending from the rear end of the inner sleeve to the front end of the inner sleeve a second distance greater than the first distance, the air resonating in the acoustical channel forming a Helmholtz resonator with the internal volume.

9. The speaker of claim 8 wherein the channel is curvilinear.

10. The speaker of claim 8 wherein the channel describes a path of greater than 0° and less than 360°.

11. The speaker of claim 8 wherein the channel comprises a spiral which completes a 360° revolution from the rear end of the inner sleeve to the front end of the inner sleeve.

12. The speaker of claim 11 wherein the channel comprises a spiral which completes a revolution of between about 180 to 360° from the rear end of the inner sleeve to the front end of the inner sleeve.

13. The speaker of claim 8 wherein the channel comprises a plurality of channels which extend from the rear end of the inner sleeve to the front end of the inner sleeve each of which describe a revolution of about 180° from the rear end of the inner sleeve to the front end of the inner sleeve.

14. The speaker of claim 8 which comprises a plurality of channels formed in the annulus, each of said channels describing a revolution of 360° from the rear end of the inner sleeve to the front end of the inner sleeve.

* * * * *